(12) United States Patent
Kisakuerek

(10) Patent No.: US 9,137,920 B2
(45) Date of Patent: Sep. 15, 2015

(54) ELECTRONIC ASSEMBLY

(75) Inventor: Hakan Kisakuerek, Munich (DE)

(73) Assignee: Diehl BGT Defense GmbH & Co. KG, Nuernberg (DE)

( * ) Notice: Subject to any disclaimer, the term of this patent is extended or adjusted under 35 U.S.C. 154(b) by 594 days.

(21) Appl. No.: 13/491,809

(22) Filed: Jun. 8, 2012

(65) Prior Publication Data

US 2012/0243181 A1    Sep. 27, 2012

Related U.S. Application Data

(63) Continuation of application No. PCT/EP2010/007118, filed on Nov. 24, 2010.

(30) Foreign Application Priority Data

Dec. 8, 2009  (DE) .......................... 10 2009 057 272

(51) Int. Cl.
*H05K 7/00* (2006.01)
*H01R 13/62* (2006.01)
*H05K 7/14* (2006.01)

(52) U.S. Cl.
CPC ............ *H05K 7/1477* (2013.01); *H05K 7/1484* (2013.01)

(58) Field of Classification Search
CPC ............................. H05K 7/1492; H01R 23/68
USPC ............... 361/679.01–679.09, 679.1–679.19, 361/679.21–679.29, 679.31–679.45, 361/679.55–679.6, 724–747; 345/156, 157, 345/168–172
See application file for complete search history.

(56) References Cited

U.S. PATENT DOCUMENTS

| 4,698,729 | A | 10/1987 | Riesner et al. |
| 5,261,828 | A * | 11/1993 | Kandybowski ................. 439/79 |
| 6,661,671 | B1 | 12/2003 | Franke et al. |
| 6,778,389 | B1 | 8/2004 | Glovatsky et al. |
| 2009/0040740 | A1 | 2/2009 | Muller et al. |
| 2009/0043937 | A1 | 2/2009 | Lee et al. |
| 2009/0086441 | A1* | 4/2009 | Randall et al. ................ 361/724 |

FOREIGN PATENT DOCUMENTS

| DE | 102 44 365 A1 | 4/2004 |
| DE | 20 2007 011 113 U1 | 11/2007 |
| EP | 1 120 695 A2 | 8/2001 |
| GB | 2 181 900 A | 4/1987 |
| WO | 00/55742 A2 | 9/2000 |

OTHER PUBLICATIONS

International Search Report of PCT/EP2010/007118, Mar. 1, 2011.

* cited by examiner

*Primary Examiner* — Jerry Wu
(74) *Attorney, Agent, or Firm* — Laurence A. Greenberg; Werner H. Stemer; Ralph E. Locher

(57) ABSTRACT

An electronic assembly has a plurality of functional units each including a board element populated with electronic modules, which board element has in each case a number of contact locations arranged in at least one row, and a contact board, which has for each board element at least one row of contact receptacles that are directly electrically connected to the contact locations of the associated board element. These rows point toward a side of the contact board in their longitudinal direction. A plurality of similar assemblies are produced compactly and cost-effectively by providing a communication unit separate from the contact board and serving for communication with modules of the board elements. The communication unit is connected to the contact board via a plurality of data lines which are contact-connected to the contact board on the side to which the rows point.

10 Claims, 5 Drawing Sheets

ELECTRONIC ASSEMBLY

CROSS-REFERENCE TO RELATED APPLICATION

This application is a continuation, under 35 U.S.C. §120, of copending international application PCT/EP2010/007118, filed Nov. 24, 2010, which designated the United States; this application also claims the priority, under 35 U.S.C. §119, of German patent application DE 10 2009 057 272.4, filed Dec. 8, 2009; the prior applications are herewith incorporated by reference in their entirety.

BACKGROUND OF THE INVENTION

Field of the Invention

The invention relates to an electronic assembly having a plurality of functional units each comprising a board element populated with electronic modules, which board element has in each case a number of contact locations arranged in at least one row, and a contact board, which has for each board element at least one row of contact receptacles that are directly electrically connected to the contact locations of their board element. The rows of contact receptacles point toward a side of the contact board in their longitudinal direction.

Electronic assemblies for controlling complex processes usually comprise a plurality of functional units each respectively on a circuit board, which are allocated different tasks. In this case, the complex control task is achieved by an interaction of the functional units processing the different partial tasks.

The mechanical and signaling connection of the individual functional units is usually realized by way of a so-called backplane, which is also referred to as a bus circuit board. Such a backplane comprises a slot for each functional unit, by means of which the assembly is fixedly connected to the backplane mechanically and in terms of signaling. The individual slots are wired to one another according to the task of the electronic assembly and the individual partial tasks of the functional units, such that the functional units can communicate with one another and achieve their partial tasks by data exchange among one another. These electrical connections produced by the backplane between the slots can vary greatly and determine the architecture of the backplane and of the electronic assembly.

By virtue of the task-specific wiring, backplanes are a central constituent of integrated, computer-controlled systems, primarily appertaining to telecommunications, metrology and automation, medical technology or aeronautics and rail road technology. As the central element, the backplane forms a bus architecture for the connection of the individual pins of the slots and thus of the individual contact locations of all the functional units.

SUMMARY OF THE INVENTION

It is accordingly an object of the invention to provide an electronic assembly which is improved relative to the heretofore-known devices and methods of this general type and which can be produced compactly and cost-effectively.

With the foregoing and other objects in view there is provided, in accordance with the invention, an electronic assembly comprising:

a plurality of functional units each including a board element populated with electronic modules, each board element having a plurality of contact locations arranged in at least one row;

a contact board having at least one row of contact receptacles for each said board element, said contact receptacles being directly electrically connected to said contact locations of a respective said board element and said rows, in a longitudinal direction thereof, point to a side of said contact board;

a communication unit separate from said contact board and serving for communication with modules of said board elements;

a plurality of data lines connecting said communication unit to said contact board, said data lines being contact-connected to said contact board on said side to which said rows point.

In other words, the objects are achieved by way of an electronic assembly of the type mentioned in the introduction which, according to the invention, comprises a communication unit that is separate from the contact board and that serves for communication with modules of the board elements. The communication unit is connected to the contact board via a plurality of data lines. The data lines are contact-connected to the contact board on the side to which the rows point. Such a geometry makes it possible to achieve a rerouting of data lines, in particular between the functional units, such that a compact design of the electronic assembly is made possible.

In this case, the invention is based on the consideration that from among the functional units at least individual functional units communicate with systems outside the electronic assembly in order to bring about a control or to be able to receive sensor or control signals. For this purpose, the individual functional units are prepared in accordance with their tasks for communication toward the outside, such that they are provided with corresponding settings with regard to a required data transmission rate, data form and/or a transmission protocol. If a plurality of similar assemblies are produced for managing similar tasks in similar control processes, then it is advantageous if the different assemblies can be embodied identically at least with regard to their functional units, in order to simplify manufacture. This simplification is impeded by the necessary communication adaptation of the individual functional units to external control units, actuators or sensors. Since such a communication adaptation is generally necessary for a plurality of functional units of an electronic assembly, it is particularly expedient to centralize it. An appropriate central functional unit in this case is a backplane, which constitutes a central functional unit of the assembly.

The invention is based on the further consideration that the individual functional units are usually arranged alongside one another on the contact board, such that, by way of example, communication between the two functional units arranged at the outer position necessitates data lines which lead past the inner functional units. The more functional units involved, the greater the complexity and the larger the volume of the contact board, owing to more and longer data lines. In the case where the backplane is separated into a contact part—the contact board—and a communication part—the communication unit—it is possible to achieve the advantage that complex data paths can be removed from the contact board. As a result, the backplane overall can be kept compact and simple.

The contact board can be a backplane which connects the individual functional units to one another both in terms of signaling and mechanically. The longitudinal direction is expediently parallel to the relevant board element, in particular the longitudinal directions of all the rows being parallel. Expediently, the data lines are mechanically connected to the contact board on the side to which the rows point. In particular, the side is straight, at least in the region in which the data lines are contact-connected to it. The connection of the contact locations to the contact receptacles can be a plug connection. The connection is realized particularly advantageously by leadthrough technology and soldering of the contact locations in the contact receptacles.

The electronic assembly can be a control unit for the autonomous control of a system, for example for the control of a missile. The board elements can be circuit boards which are also mechanically connected to one another via the contact board. A module can be a processor or comprise one or a plurality of electronic components. The communication unit expediently forms a dedicated board element mounted separately from the contact board in the electronic assembly. In this case, it is advantageous if the communication unit is mounted mechanically separately from the contact board in a housing, for example.

The communication unit is advantageously embodied such that it forms an information-linking communication interface between at least one internal communication mode of a functional unit with an external communication mode—different therefrom—of a unit outside the electronic assembly. A communication interface is considered to be a unit which is provided for adapting two different communication modes to one another. The difference can reside in different communication protocols, data transfer protocols, communication data rates, signal amplitudes and the like. The external unit can be an external control unit, sensors, actuators or the like. In addition, the communication unit can be a communication interface between an internal communication mode of a functional unit and a different communication mode of a further functional unit of the electronic assembly.

It is additionally advantageous if a data connection produced by the data lines between the functional units and the communication unit form at least one high-speed bus. If appropriate, it may be sufficient if only the internal connection between the functional units, and thus data lines in the contact board, is embodied as a high-speed bus. A high-speed bus should be understood to represent a bus connection having a data rate of at least 1 Mbit/s.

In one advantageous embodiment of the invention, the data lines are directly connected to the board elements in terms of signaling. A signal from a functional unit to the communication unit therefore in particular passes through no active components, such as ICs, or passive components, such as resistors or capacitors. A direct mechanical connection is not predetermined as a result, since the data lines are expediently mechanically connected to the board elements via the contact board.

A mechanically durable yet structurally very flexible embodiment of the data line can be achieved if the latter run to the communication unit in a flexible strip. They can all run parallel as a ribbon cable, in which case they are expediently incorporated into a film. High stability against damage as a result of shaking and vibration, for example, is also achieved by means of a rigid-flexible-rigid connection of the contact board to the communication unit. The loading capacity and flexibility of the construction can be increased further if further data lines run from the communication unit in the direction of an interface toward the outside in a flexible strip. Said flexible strip can be the same as the flexible strip with respect to the contact board, the interface being an interface to, by way of example, an external control unit, functional unit, actuators, sensors or the like.

Advantageously, the communication unit is embodied as a board, which is expediently arranged in a manner angled with respect to the contact board. The angle between the contact board and the communication unit is expediently at least substantially a right angle.

A housing function can be achieved and, consequently, additional structural parts can be obviated if the communication unit and the contact board reach around the board elements from at least two sides. A right-angled arrangement of the communication unit and the contact board is particularly advantageous in this case.

The modularity principle can be further fostered if the contact board is passive and the communication unit is active. In this context, activity is understood to mean the population with active components, such as ICs, or passive components, such as resistors or capacitors. Accordingly, the contact board is passive if it carries no active or passive components, but rather is only provided with data lines, for example, in which the data or signals are passed in particular without any data processing from an input contact to an output contact.

Moreover, it is proposed that, as an additional feature or, in particular, instead of the features according to the invention in the characterizing part of claim 1, at least one of the board elements is shielded from the other board elements by means of a housing. Expediently, the housing surrounds the board element. The latter can thus be mounted particularly fixedly, securely and in a manner insusceptible to faults. If at least two of the board elements are surrounded by a respective housing, which are rigidly connected to one another, particularly stable mounting of the functional units can be ensured. In particular, all board elements or functional units are mounted in this form.

Moreover, it is proposed that the housing or housings each have a shaped portion which makes mechanical contact with an inner region of the board element or relevant board element. A support of the board element in the inner region can be achieved in this way, inner region being understood to mean such a region that is at a distance of at least 2 cm from the board edge. Expediently, the contact-connection is an island-type contact that is at a distance from the edge of the corresponding board element.

In a further embodiment of the invention, the housing is metallic and a shaped portion of the housing makes thermal contact with the board element. The thermal connection expediently lies in the region of the mechanical contact-connection, such that a heat sink can be implemented in the inner region of the board element. As a result, a processor can be particularly effectively cooled in the inner region of the board element. Alternative or additional cooling is achieved if the board element makes contact in particular all around the housing via a thermal contact layer, in particular a gold layer. In the inner region, in particular, a thermal contact-connection via a gel pad is advantageous.

Other features which are considered as characteristic for the invention are set forth in the appended claims.

Although the invention is illustrated and described herein as embodied in an electronic Assembly, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL
VIEWS OF THE DRAWING

DETAILED DESCRIPTION OF THE INVENTION

Figure 1:
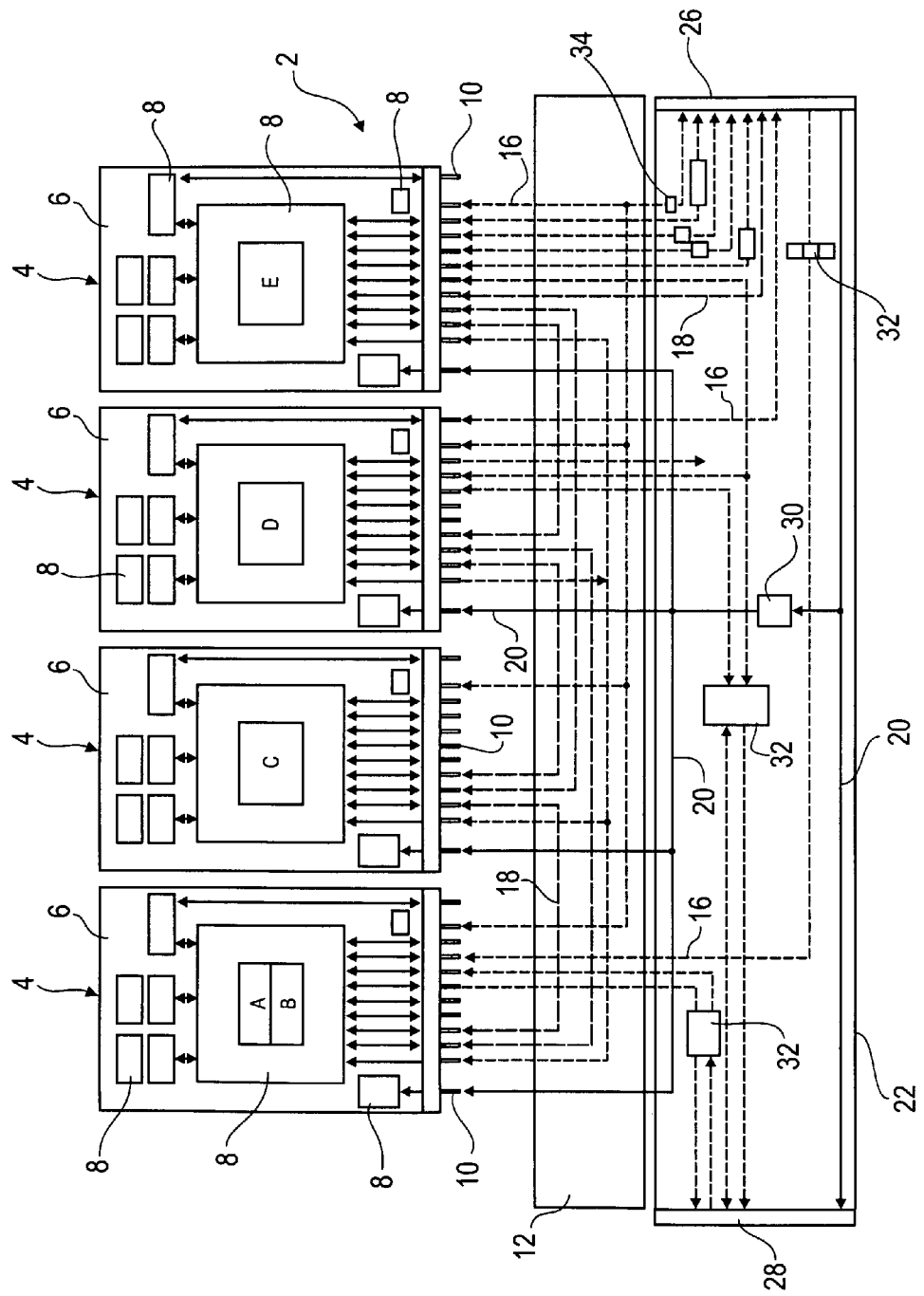
FIG. 1 shows a circuit diagram of an electronic assembly formed of a plurality of functional units, a contact board and a communication unit.

FIG. 1 shows a schematic circuit diagram of an electronic assembly 2 comprising four functional groups 4, each comprising a board element 6 in the form of a circuit board and electronic modules 8 arranged thereon. The electronic assembly 2 serves for controlling a guided missile and for evaluating signals of a homing head. A module 8 can be understood to be one or a plurality of electronic components which individually or jointly fulfill a function. In each of said functional groups 4, one of the modules 8 is a central processor equipped with software, that is to say one or a plurality of electronic data processing programs, for example in the form of firmware and additional freely programmable software. Each processor is thereby able to process a range of tasks or a function, wherein the functions of the processors are different and are indicated symbolically by the letters A to E in FIG. 1. Apart from the different programming, the functional groups 4 are embodied completely identically with regard to their hardware, that is to say their electronic modules 8 and the wiring thereof, that is to say the line routing among one another and toward the outside, and are also identical otherwise.

Each of the board elements 6 carries a number of contact locations 10 in the form of pins by which the functional groups 4 are connected to a contact board 12 in terms of signaling and for power supply purposes and also mechanically. For this purpose, the contact locations 10 are inserted into corresponding contact receptacles 14 (see FIG. 3) of the contact board 12 in the form of metalized holes and are soldered, thus giving rise to a fixed mechanical and electrical connection between the board element 6 and the contact board 12. The contact board 12 in turn is connected to a communication unit 22 via a plurality of data lines 16, 18 and power supply lines 20, wherein the data lines 16, 18 and power supply lines 20 are incorporated into a film 24 (see FIG. 3) in the form of a ribbon cable.

The data lines 16, 18 and further data lines 16, 18 are laid in the contact board 12 such that a functionally related communication of the functional groups 4 among one another is made possible. Thus, data lines 18 embodied as high-speed buses, which are indicated by long dashes in FIG. 1, are arranged between the functional groups 4 in such a way that each of the functional groups 4 is connected directly or via a further functional group 4 to all the functional groups 4 via such a data line. A further such data line 18 is led via the communication unit 22 toward the outside, that is to say to outside the electronic assembly 2, and for this purpose leads into an interface 26, for example in the form of a plug, for connection to an external device, e.g. a control unit or a unit comprising actuators for actuating mechanical objects. Via further data lines 16, which are indicated by shorter dashes in FIG. 1, the functional groups 4 communicate via the interface 26 and a further interface 28 with the outside world, e.g. further functional groups, sensors or the like, which, for this purpose, are connected to the interfaces 26, 28 in terms of signaling.

Via a power supply line 20, the communication unit 22 can be supplied externally by a voltage for power supply purposes, in particular 5V, 12V or 28V, the latter being fed to a power supply unit 30. In the latter, the voltage is stepped down to a lower voltage, for example 3.3V, and passed on to the functional groups 4 via the further power supply lines 20. Said functional groups each likewise have a power supply unit, indicated as module 8 in FIG. 1, for further transformation into one or a plurality of operating voltages of the modules 8 of the functional groups 4, for example 1.0V, 1.8V and 2.5V.

In terms of their functions, the contact board 12 and the communication unit 22 perform the tasks of a so-called backplane that connects a plurality of functional units to one another. In the exemplary embodiment illustrated in FIG. 1, said backplane, which is usually unified per se, is subdivided into two units, namely the passive contact board 12, which therefore carries no electronic modules whatsoever, and the active communication unit 22, which serves as a communication interface for the functional groups 4 or the modules 8 thereof toward the outside. For this purpose, the communication unit 22 carries components 32 prepared for adapting the communication of the modules 8 of the functional groups 4 to a communication to be carried out toward the outside. Thus, the components 32 adapt, for example, a communication protocol and/or an amplitude of communication signals from an internal communication to an external communication, and vice versa, such that a communication adaptation of the individual functional groups 4 can be obviated. Independently of their tasks indicated by the letters A to E, therefore, the latter can be embodied identically since the communication properties associated with the tasks are implemented toward the outside by corresponding components 32 of the communication unit 22.

On the basis of the exemplary embodiment illustrated in FIG. 1 it can be illustrated how a plurality of electronic assemblies embodied analogously to the assembly 2 can be produced efficiently for different tasks. Thus, alongside the electronic assembly 2 illustrated in FIG. 1, a further assembly 2 can be conceived, which is prepared for a different control task, for example of a different missile or of a different automation device. Both electronic assemblies 2 in each case comprise a number of functional groups 4, wherein the numbers need not be identical. The functional groups 4 are respectively inserted into a contact board 12 or soldered therein and connected to the communication unit 22 in the manner corresponding to the illustration in FIG. 1.

The central processors of the functional groups 4 are programmed according to the tasks. Otherwise, all functional groups 4 of both assemblies 2 can be embodied identically. In the case of similar tasks, the two contact boards 12 of the two assemblies 2 can also be embodied identically, only the communication unit 22 being adapted to the corresponding control units, sensors or the like. For this purpose, the two communication units 22 can carry different components 32 and be wired differently, that is to say have e.g. different line outputs at the interfaces 26, 28. In the case of very different tasks of the two assemblies 2, the contact boards 12 can also be correspondingly adapted to the tasks, such that the wiring, that is to say the line routings of the lines 16, 18 and, if appropriate, also of the power supply lines 20, is different and optimized to the tasks. By virtue of this modular construction, the same functional groups 4 and, if appropriate, even the same contact boards 12 can always be used for both assemblies 2. Adaptations of the electronic assemblies 2 to different tasks can therefore be achieved by simple changes in manufacture of the communication unit 22 and, if appropriate, of the contact board 12. A configuration of the functional groups 4 and an adaptation of the backplane to this configuration are no longer necessary.

A further task that can be assigned to the communication unit 22 is a switch-on sequencing of the individual functional groups 4. In order not to overload a voltage source, it is advantageous if, upon an initialization of the assembly 2, the individual functional groups 4 do not start at the same time, since, in such a case, many modules 8 have a high power consumption, which places high demands on the power supply. If it was previously customary for a first functional group 4 to switch on first, then to pass a switch-on signal to a next functional group 4, which in turn triggers the switch-on of a further functional group 4, such a switch-on sequencing can now be carried out by a component 32 of the communication unit 22. By this means, too, a specific adaptation of the functional groups 4 to a desired switch-on sequencing is obviated, since they are completely freed of the task of the switch-on sequencing. Corresponding signals can be passed from a component 32 via a data line 16 to the functional groups 4, which switch on at the command of the communication unit 22. The standardizability of the functional groups 4 can be increased further by means of this distribution of tasks adapted to the modularity of the assembly 2.

Identification of faults and rectification of faults are accorded high importance in electronic assemblies 2. For the simple and centralized management of this task, the communication unit 22 carries a component 34 configured as a test interface. By means of this test interface, each of the functional groups 4 can be accessed with test signals and corresponding output signals for checking the function of the functional groups 4 can be tapped off at the interface 26. A corresponding preparation at the individual functional groups 4 can be obviated, such that the latter—independently of their functions impressed by programming—can be tested in respect of the correct processing of their tasks. Particular requirements made of the hardware or wirings by such tests can be implemented in the communication unit 22. An adaptation which is necessary with regard to the different tasks of the functional groups 4 therefore again only concerns the communication unit 22, such that a high standardization of the rest of the functional units of the assembly 2 can be achieved.

Figure 2:
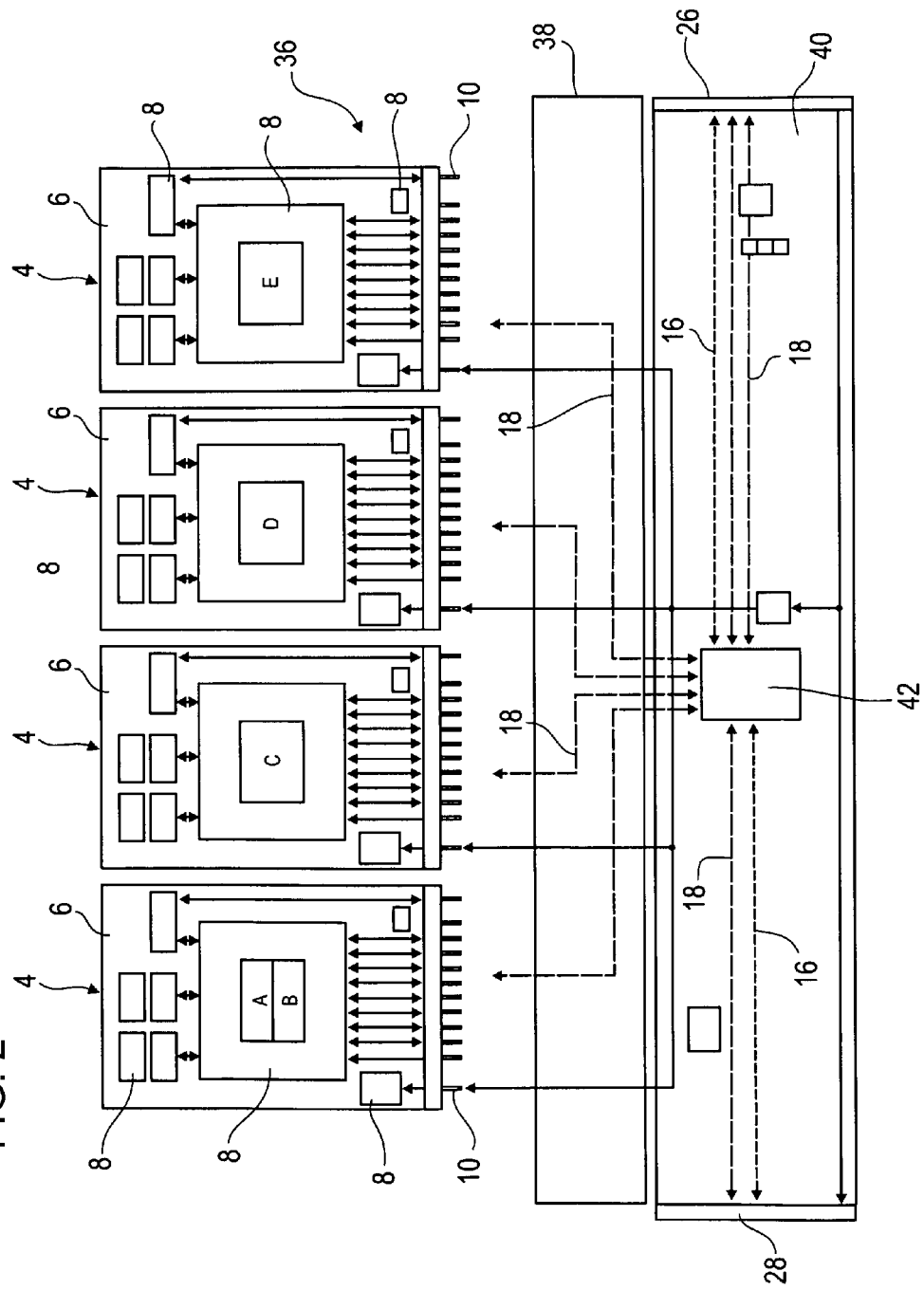
FIG. 2 is a similar diagram showing an alternative electronic assembly comprising a router on the communication unit.

A further exemplary embodiment of an electronic assembly 36 is illustrated in FIG. 2. The description below is substantially restricted to the differences with respect to the exemplary embodiment from FIG. 1, to which reference is made with regard to uniform features and functions. Substantially uniform structural parts are designated by the same reference signs, in principle, and features not mentioned are adopted in the following exemplary embodiments, without being described once again.

The electronic assembly 36 is again provided with the identical functional groups 4 and a contact board 38, which is connected to a communication unit 40. The communication unit 40 carries a router 42, which is connected to individual functional groups 4 via data lines 18 embodied as a high-speed bus. The bus connection from the router 42 to the functional groups 4 is merely indicated by the arrows of the data lines 18 that end at a further distance from the contact locations 10, and is not allocated to the contact locations 10 in concrete terms in FIG. 2. Via bus connections, the router 42 is also connected to the two interfaces 26, 28, likewise merely illustrated schematically. The entire communication between the functional groups 4 passes via the router 42, which is thereby informed about all data exchange steps of the functional groups 4 among one another and toward and from the outside.

The router 42 thus forms a communication hub of the electronic assembly 36 which is embodied in non-blocking fashion, that is to say allows, in terms of its communication data rate, all modules 8 connected to it to communicate simultaneously with the data rate allocated thereto. The router 42 is prepared for logging the entire or else only defined individual areas of the communication of the functional groups 4 among one another and, in particular, also of the functional groups 4 toward the outside. In order to enable an interrogation of communication data from outside, the router 42 is embodied with a data interface toward the outside.

In this way, data concerning communication processes of the functional groups 4 can be retrieved from outside and used for example for a functional test of the functional groups 4 or eliminating faults (debugging). It is expedient to visualize these communication data or parts thereof, that is to say to represent them e.g. graphically on a screen, such that communication faults can be found rapidly and functional faults of the functional groups 4 can be deduced therefrom. It is also possible for the router 42 already to be prepared, for example by means of corresponding programming, for comparing communication data with desired data for communication and for passing data resulting from this comparison toward the outside, thereby simplifying an evaluation from outside. In this way, a targeted checking of the functional groups 4 can already be implemented in a targeted manner during the production of the electronic assembly 36.

Figure 3:
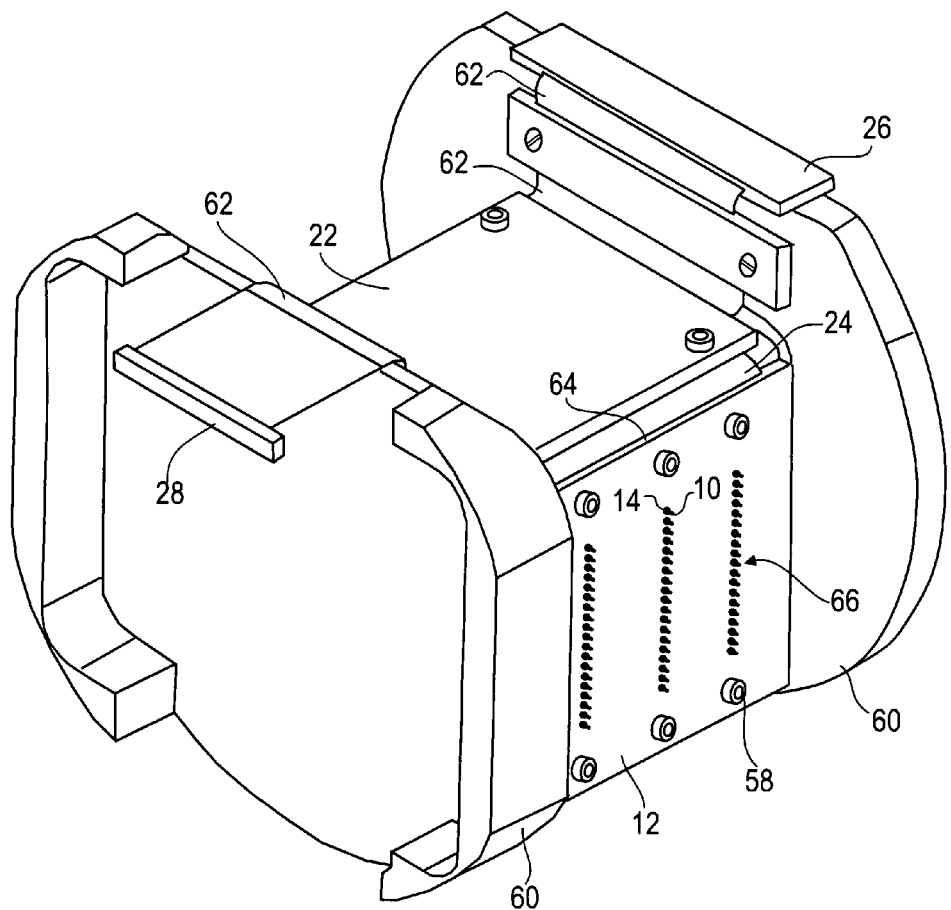
FIG. 3 shows a schematic perspective outer view of the electronic assembly.
Figure 3A:
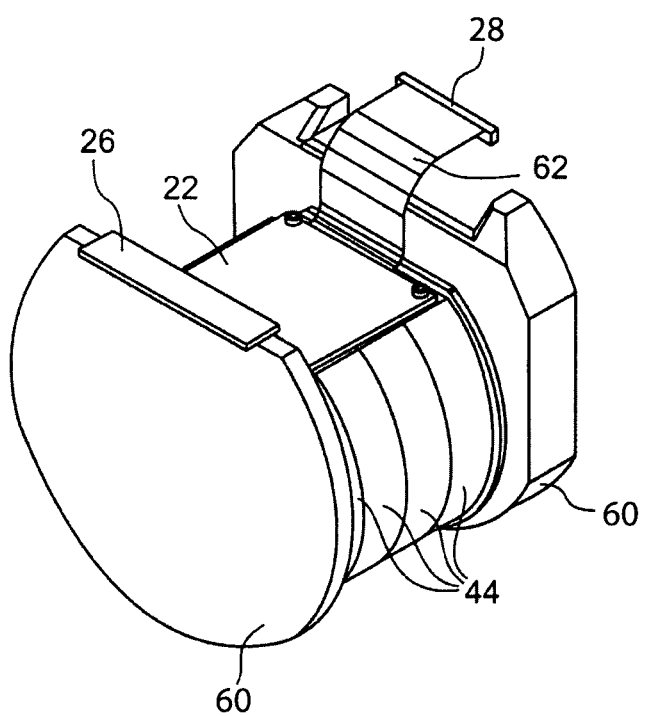
FIG. 3A shows another schematic perspective outer view of the electronic assembly.
Figure 4:
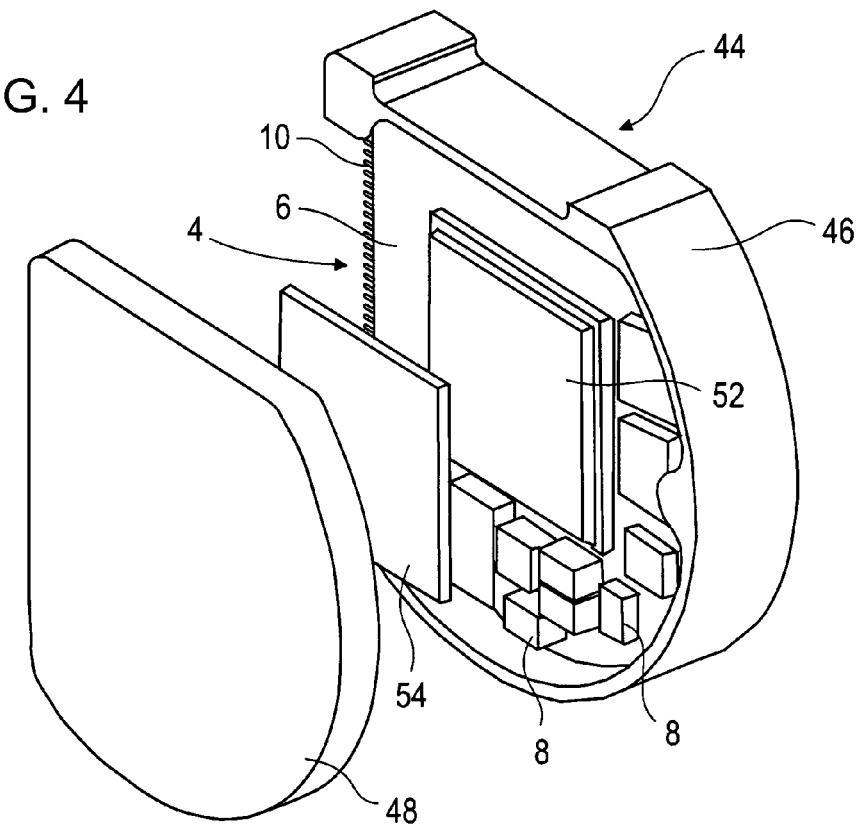
FIG. 4 shows a view of one of the functional units of the electronic assembly in a housing.
Figure 5:
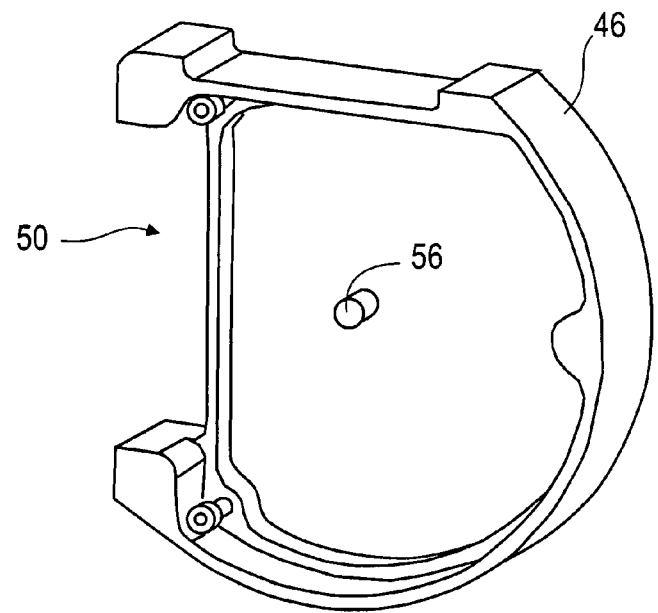
FIG. 5 is a perspective view into the housing without the structural unit.

FIGS. 3 to 5 illustrate realistic geometrical implementations of the electronic assembly 2, wherein the assembly 36 can also be embodied in a corresponding manner. As can be seen from FIG. 4, a functional group 4—and this applies to all of the functional groups 4—is mounted in a housing 44 consisting of a housing base 46 and a cover 48 to be screwed to the housing base 46. Through a lateral opening 50 (see FIG. 5), the contact locations 10 of the board element 6 project through the housing 44 toward the outside. The board element 6 is also screwed in the housing base 46.

For cooling the central processor 52, a thermal bridge 54 in the form of a gel pad is arranged between said processor and the housing cover 48, which gel pad, with the cover 48 closed, directly makes contact with both the processor 52 and the cover 48. On its other side, the processor 52 is likewise connected to a thermal sink, which is realized by a shaped portion 56—if appropriate likewise with an additional gel pad—which makes thermal contact with the board element 6 on its non-illustrated rear side directly or via the gel pad. Thermal contact is thereby made with the board element 6 in an inner region spaced apart from the edge region of the board element 6, such that heat emitted by the processor 52 via the shaped portion 56 is passed directly into the housing 44. Moreover, the board element 6 is held mechanically in its inner region and thereby particularly protected against strong vibrations.

The four housings 44 of the four functional groups 4 are screwed to one another in the finished state of the assembly 2 and thereby form a mechanically very stable assemblage. This assemblage is additionally screwed to the contact board 12, as is illustrated with the aid of indicated screws 58. Any other mechanical fixing by some other fixing means is also conceivable.

Placed around this fixed assemblage are the contact board 12, the line-carrying film 24 and the communication unit 22, which together engage around the functional groups 4 from two sides. The assembly 2 is thereby embodied in a very compact fashion. By means of a screw joint or some other suitable fixing, the communication unit 22 is additionally connected to the functional groups 4—to the housing 44 of at least one functional group 4 in the concrete exemplary embodiment shown—, thus giving rise to a mechanically particularly stable assembly. On the basis of an outer supporting structure 60, the assembly 2 can be incorporated mechanically stably in an environment, for example a guided missile. The signaling connection toward the outside takes place in this case via the two interfaces 26, 28, which are embodied as plugs, for example, and can be connected to a homer or a guiding part. Both interfaces 26, 28 are connected, analogously to the film 24, to the communication unit 22 via flexible connectors 62, such that signaling contact is made with the communication unit 22 on three sides (one side is not visible, but embodied in the same way) in the design fixed-flexible-fixed.

In order to achieve a particularly compact and resource-saving geometry of the assembly 2, the communication unit 22 is arranged in a specific geometry with respect to the contact board 12. In the case of this geometry, the board elements 6 conceived of in lengthened fashion intersect the communication unit 22. In the case of a smaller communication unit 22 it is sufficient if at least one of the board elements 6 in a conceptually lengthened form intersects the communication unit 22. In general terms, the communication unit 22 is connected to the contact board 12 via a plurality of data lines 16, 18, wherein the data lines 16, 18 are connected to the contact board 12 on that side 64 thereof toward which the rows 66 of the contact locations 10 of the board elements 6 face, as is illustrated in FIG. 3.

In the case of the exemplary embodiment shown, contact board 12 and communication unit 22 form a right angle with one another, other angles likewise being conceivable. A parallelism of board elements 6 and of the communication unit 22 is not provided, in particular. By virtue of this geometry, the data lines 16, 18 can be led from the functional groups 4 to the communication unit 22, without having to cross an imaginary line respectively formed by the rows 66. An imaginary line in a lengthening of the rows 66, which are in each case parallel to the board element 6 assigned thereto, therefore points directly toward the side 64 and toward the communication unit 22 or a corresponding contact-connection of a data line 16, 18 from the contact board 12 to the communication unit 22.

The following is a list of reference numerals and the corresponding elements described in the above specification:
2 Assembly
4 Functional group
6 Board element
8 Module
10 Contact location
12 Contact board
14 Contact receptacle
16 Data line
18 Data line
20 Power supply line
22 Communication unit
24 Film
26 Interface
28 Interface
30 Power supply unit
32 Component
34 Component
36 Assembly
38 Contact board
40 Communication unit
42 Router
44 Housing
46 Housing base
48 Cover
50 Opening
52 Processor
54 Bridge
56 Shaped portion
58 Screw
60 Supporting structure
62 Connector
64 Side
66 Row

The invention claimed is:

1. An electronic assembly comprising:
a plurality of functional units each including a board element populated with electronic modules, each board element having a plurality of contact locations arranged in at least one row;
a contact board having at least one row of contact receptacles for each said board element, said contact receptacles being directly electrically connected to said contact locations of a respective said board element and said at least one row, in a longitudinal direction thereof, point being pointed to a side of said contact board;
a communication unit separate from said contact board and serving for communication with said electric modules of said board elements;
a plurality of data lines connecting said communication unit to said contact board, said data lines being contact-connected to said contact board on said side to which said rows point.

2. The electronic assembly according to claim 1, wherein said data lines are connected directly to said board elements in terms of signaling.

3. The electronic assembly according to claim 1, wherein said data lines run to the communication unit in a flexible strip and further data lines run from said communication unit in a direction of an interface toward the outside in a flexible strip.

4. The electronic assembly according to claim 1, wherein said communication unit is a board and is angled with respect to said contact board.

5. The electronic assembly according to claim 1, wherein said communication unit and said contact board reach around said board elements from two sides.

6. The electronic assembly according to claim 1, wherein said contact board is a passive contact board.

7. The electronic assembly according to claim 1, wherein said communication unit is an active unit.

8. The electronic assembly according to claim 1, which comprises at least two housings each surrounding a respective said board element, wherein said housings are rigidly connected to one another.

9. The electronic assembly according to claim 8, wherein said housing has a shaped portion making mechanical contact with an inner region of said respective board element.

10. The electronic assembly according to claim 8, wherein said housings are metallic and each housing has a shaped portion disposed in thermal contact with said respective board element.

* * * * *